United States Patent
Shirakami et al.

(10) Patent No.: US 11,315,885 B2
(45) Date of Patent: Apr. 26, 2022

(54) ELECTRONIC COMPONENT PACKAGE INCLUDING STACKED SHIELD LAYERS AND METHOD FOR PRODUCING SAME

(71) Applicant: DIC Corporation, Tokyo (JP)

(72) Inventors: Jun Shirakami, Takaishi (JP);
Norimasa Fukazawa, Takaishi (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 16/962,300

(22) PCT Filed: Feb. 21, 2019

(86) PCT No.: PCT/JP2019/006474
§ 371 (c)(1),
(2) Date: Jul. 15, 2020

(87) PCT Pub. No.: WO2019/167778
PCT Pub. Date: Sep. 6, 2019

(65) Prior Publication Data
US 2020/0373248 A1    Nov. 26, 2020

(30) Foreign Application Priority Data
Feb. 27, 2018   (JP) .............................. JP2018-033326

(51) Int. Cl.
*H01L 23/552*    (2006.01)
*H01L 21/56*    (2006.01)

(52) U.S. Cl.
CPC .......... *H01L 23/552* (2013.01); *H01L 21/561* (2013.01)

(58) Field of Classification Search
CPC ..... H01L 23/552; H01L 21/561; H01L 23/28; H01L 21/56; H01L 23/00
(Continued)

(56) References Cited

U.S. PATENT DOCUMENTS

| 9,953,930 B1 * | 4/2018 | Chiu ........................ H01L 23/06 |
| 2008/0011192 A1 * | 1/2008 | Uozumi ................. C09D 11/36 106/31.75 |

(Continued)

FOREIGN PATENT DOCUMENTS

| JP | 2005-109306 A | 4/2005 |
| WO | 2010/029635 A1 | 3/2010 |

(Continued)

OTHER PUBLICATIONS

International Search Report dated Apr. 9, 2019, issued in counterpart International Application No. PCT/JP2019/006474 (1 page).

*Primary Examiner* — Didarul A Mazumder
(74) *Attorney, Agent, or Firm* — Westerman, Hattori, Daniels & Adrian, LLP

(57) ABSTRACT

The present invention provides an electronic component package including an electronic component mounted on a circuit board having a ground pattern, a mold containing an epoxy resin that encapsulates the electronic component, and a shield layer formed on the mold. The shield layer is formed by stacking a metal particle layer, a copper plating layer, and a nickel plating layer in this order from the mold side, and the shield layer is grounded to the ground pattern. The present invention also provides a method for manufacturing the electronic component package. The electronic component package is excellent in the adhesion of the shield layer.

3 Claims, 1 Drawing Sheet

(58) Field of Classification Search
USPC .......................................... 257/659; 438/660
See application file for complete search history.

(56) References Cited

U.S. PATENT DOCUMENTS

| | | | |
|---|---|---|---|
| 2009/0198009 A1* | 8/2009 | Matsuki | B82Y 30/00 |
| | | | 524/440 |
| 2009/0206754 A1* | 8/2009 | Usui | H05K 9/0096 |
| | | | 313/635 |
| 2011/0168430 A1 | 7/2011 | Hata | |
| 2016/0027740 A1* | 1/2016 | Chiu | H01L 21/4853 |
| | | | 257/659 |
| 2016/0167130 A1* | 6/2016 | Ida | C09D 11/037 |
| | | | 424/418 |
| 2016/0276288 A1* | 9/2016 | Lee | H01L 23/552 |
| 2017/0345789 A1 | 11/2017 | Miwa | |
| 2017/0358540 A1* | 12/2017 | Min | H01L 23/295 |
| 2018/0151478 A1* | 5/2018 | Chen | H01L 24/94 |
| 2018/0158782 A1* | 6/2018 | Kawabata | H01L 24/95 |
| 2018/0206368 A1 | 7/2018 | Murakawa et al. | |

FOREIGN PATENT DOCUMENTS

| | | |
|---|---|---|
| WO | 2013/146195 A1 | 10/2013 |
| WO | 2015/037511 A1 | 3/2015 |
| WO | 2016/092691 A1 | 6/2016 |

\* cited by examiner

ELECTRONIC COMPONENT PACKAGE INCLUDING STACKED SHIELD LAYERS AND METHOD FOR PRODUCING SAME

TECHNICAL FIELD

The present invention relates to an electronic component package and a method for manufacturing the same.

BACKGROUND ART

In recent years, in a portable information terminal such as a smartphone, a semiconductor package called a system-in-package (SiP), which operates as one functional block by mounting an IC and a large number of electronic components on one semiconductor package, has been widely used. Such a semiconductor package is provided with a countermeasure against electromagnetic wave noise so as to prevent malfunction due to external noise and prevent itself from becoming a noise source. For example, although not related to a system-in-package, PTL 1 discloses an electronic component package including a plurality of plating layers as layers for shielding electromagnetic wave noise.

However, in the above-described electronic component package, although the plating layer is directly provided as a shield layer on a mold in which the electronic component is encapsulated, there is a disadvantage that the plating layer is easily peeled off from the mold.

CITATION LIST

Patent Literature

PTL 1: JP-A-2005-109306

SUMMARY OF INVENTION

Technical Problem

An object of the present invention is to provide an electronic component package in which a copper plating layer and a nickel plating layer are provided as a shield layer on a mold in which an electronic component is encapsulated, the electronic component package having excellent adhesion between the shield layer and the mold, and a method for manufacturing the electronic component package.

Solution to Problem

As a result of intensive studies to solve the above-mentioned problems, the present inventors have found that an electronic component package including a mold containing an epoxy resin for encapsulating an electronic component and a shield layer formed on the mold, wherein the shield layer is formed by stacking a metal particle layer, a copper plating layer and a nickel plating layer in this order from the mold side, has remarkably excellent adhesion between the shield layer and the mold and excellent electromagnetic wave shielding properties, and thus the present invention has been completed.

That is, the present invention provides an electronic component package including: an electronic component mounted on a circuit board having a ground pattern; a mold containing an epoxy resin that encapsulates the electronic component; and a shield layer formed on the mold, wherein the shield layer is formed by stacking a metal particle layer, a copper plating layer, and a nickel plating layer in this order from the mold side, and wherein the shield layer is grounded to the ground pattern, and a method for manufacturing the electronic component package.

Advantageous Effects of Invention

The electronic component package of the present invention can be suitably used as, for example, a semiconductor package provided with a shield layer for enhancing the shielding effect of electromagnetic wave noise of a semiconductor device, or an integrated module in which a plurality of modules are densely mounted by integrating functions of a high-frequency module, a front-end module including a filter, a communication module for transmission and reception, and the like into one function.

DESCRIPTION OF EMBODIMENTS

Figure 1:
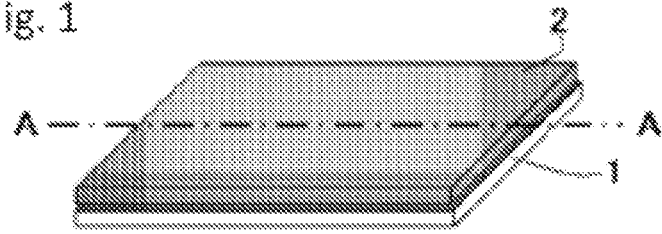
FIG. 1 shows the entire electronic component package with a shield layer.
Figure 2:
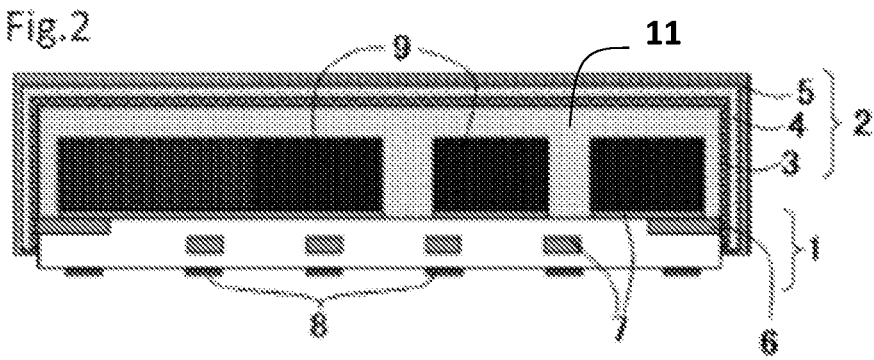
FIG. 2 shows a cross section (A-A) of the electronic component package of FIG. 1.
Figure 3:
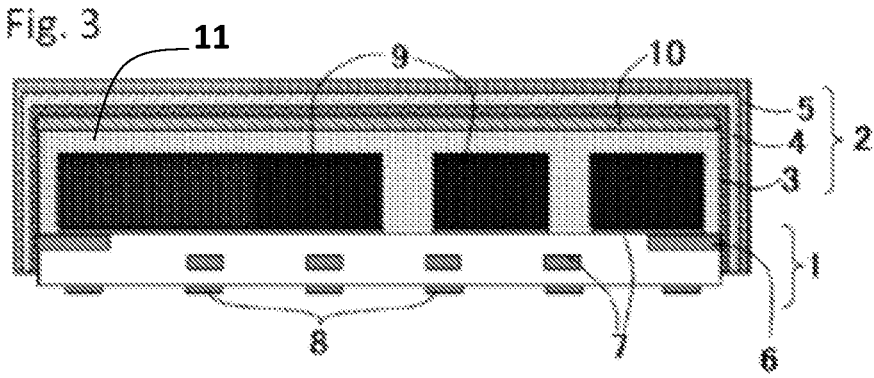
FIG. 3 shows a cross section of an electronic component package in which a polymer layer is provided on the surface of a mold.
Figure 4:
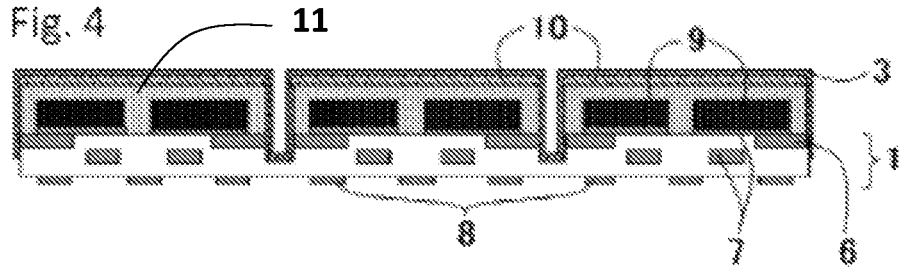
FIG. 4 shows a cross section of a state in which a polymer layer is provided on the surface of a mold, a slit portion is formed along a scheduled division line, and a metal particle layer is provided thereon. Finally, a copper plating layer and a nickel plating layer are sequentially stacked on the metal particle layer to form the electronic component package of the present invention.

The electronic component package of the present invention is an electronic component package including: an electronic component mounted on a circuit board having a ground pattern; a mold containing an epoxy resin that encapsulates the electronic component; and a shield layer formed on the mold, wherein the shield layer is formed by stacking a metal particle layer, a copper plating layer, and a nickel plating layer in this order from the mold side, and wherein the shield layer is grounded to the ground pattern.

The circuit board having the ground pattern preferably has a structure in which a part of the ground pattern is exposed on the surface of the mold, and excellent electromagnetic wave shielding properties can be obtained by connecting a shield layer described later and the ground pattern.

In the circuit board having the ground pattern, the ground pattern and a wiring pattern may be formed in at least two layers on a substrate made of an insulating material such as glass epoxy resin. In addition, when the circuit board is formed of two or more layers, a structure in which the layers are electrically connected by via holes is preferable.

As the circuit board having the ground pattern, a circuit board for mounting at least two semiconductor devices in a planar or three dimensional arrangement on a substrate made of an insulating material, or a circuit beard for an integrated module in which a plurality of modules are densely mounted by integrating functions of a high-frequency module, a front-end module including a filter, a communication module for transmission and reception, and the like into one function may be used.

Examples of the material of the circuit board having the ground pattern include an insulating material such as a glass epoxy resin, a liquid crystal polymer, a fluororesin represented by polytetrafluoroethylene, a silicone resin, a photosensitive insulating material such as a polyimide resin, or a polybenzoxazole resin, a buildup film containing a thermosetting epoxy resin, and a buildup film containing a glass cloth. These materials may be used alone or in combination of two or more kinds thereof as a substrate.

In the present invention, after an electronic component is mounted on the circuit board having the ground pattern, a mold is formed of a material containing an epoxy resin. As the material containing the epoxy resin, a material obtained by curing a thermosetting epoxy resin with a curing agent such as a phenol-based curing agent, a cyanate ester-based curing agent, or an active ester-based curing agent, or a material obtained by adding an inorganic filler represented by silica particles to the thermosetting epoxy resin, which is generally used as an encapsulating material, can be used. Examples of the method of molding the mold include a transfer molding method and a compression molding method, and a method of encapsulating the mold using an encapsulating resin sheet with a laminator or a press apparatus.

In addition, the surface of the mold may be surface-treated by, for example, a plasma discharge treatment method such as a corona discharge treatment method; a dry treatment method such as an ultraviolet treatment method; or a wet treatment method using water, an acidic or alkaline chemical solution, an organic solvent, or the like in order to further improve the adhesion to a metal particle layer described later or a polymer layer described later. Further, PTL 1 described above describes roughening treatment of the surface of the mold with a chemical agent, but in the present invention, it is preferable not to roughen the surface of the mold.

Next, in the present invention, a metal particle layer is provided to form a shield layer on the mold. The metal particle layer functions as a plating seed layer for bringing the mold and a copper plating layer described later into close contact with each other and for forming the copper plating layer described later, and is used as a catalyst for electroless copper plating or a seed conductive layer for electrolytic copper plating.

In the present invention, a polymer layer is preferably provided on the mold and between the mold and the metal particle layer in order to further improve the adhesion between the mold and the shield layer. Examples of the polymer forming the polymer layer include various resins such as a urethane resin, a vinyl resin, an acrylic resin, a urethane-acrylic composite resin, an epoxy resin, an imide resin, an amide resin, a melamine resin, a phenol resin, a polyvinyl alcohol, an a polyvinyl pyrrolidone.

Among the resins used as the polymer, a urethane resin, an acrylic resin, a urethane-acrylic composite resin, and an epoxy resin are preferable, and one or more resins selected from the group consisting of a urethane resin having a polyether structure, a urethane resin having a polycarbonate structure, a urethane resin having a polyester structure, an acrylic resin, a urethane-acrylic composite resin, and an epoxy resin are more preferable. Further, the urethane-acrylic composite resin is still more preferable because a wiring pattern excellent in adhesion and conductivity can be obtained.

When the metal particle layer is composed of metal particles dispersed by a polymer dispersant described later and the polymer dispersant contains a compound (b1) having a reactive functional group [Y] described later, the polymer forming the polymer layer is preferably a compound (a1) having a functional group [X] having reactivity with the reactive functional group [Y]. Examples of the compound (a1) having the reactive functional group [X] include compounds having an amino group, an amide group, an alkylolamide group, a carboxyl group, an anhydrous carboxyl group, a carbonyl group, an acetoacetyl group, an epoxy group, an alicyclic epoxy group, an oxetane ring, a vinyl group, an allyl group, a (meth)acryloyl group, a (blocked) isocyanate group, an (alkoxy) silyl group or the like, and a silsesquioxane compound.

In particular, when the compound (b1) having a reactive functional group [Y] in the polymer dispersant described later of the metal particle layer is a compound having a basic nitrogen atom-containing group described later, the polymer forming the polymer layer preferably has a carboxyl group, a carbonyl group, an acetoacetyl group, an epoxy group, an alicyclic epoxy group, an alkylolamide group, an isocyanate group, a vinyl group, a (meth)acryloyl group, or an allyl group as the reactive functional group [X] because the adhesion between the finally obtained mold and the shield layer can be further improved.

The polymer layer is preferably provided as a thin film on the entire surface of the mold, but in order to connect the ground pattern of the electronic component package and the shield layer, the polymer layer is preferably provided avoiding the ground pattern exposed from the mold. In addition, it is preferable that the polymer layer is not formed in a portion where the shield layer of the electronic component package is not formed. Examples of the portion where the shield layer of the electronic component package is not formed include a circuit board side opposite to the shield layer of the electronic component package, a portion where a solder ball is formed, and a portion where a solder ball is to be formed.

When the polymer forming the polymer layer is applied to the surface of the mold, a fluid in which the polymer is dissolved or dispersed in a solvent is used. Examples of the application method include a coating method, a dipping method, a roller coating method, a spin coating method, a rotary method, a spray method, a dispenser method, an inkjet printing method, a pad printing method, a reverse printing method, a flexographic printing method, a screen printing method, a gravure printing method, and a gravure offset printing method.

Further, when the fluid containing the polymer is applied, the fluid may be applied after a portion where the polymer layer is not desired to be applied is protected by a masking tape or a sealing material.

Next, the fluid containing the polymer is applied to form the polymer layer and then dried. The drying is performed in order to volatilize a solvent contained in the fluid containing the polymer. The drying is preferably performed in a temperature range of 80 to 300° C. for about 1 to 200 minutes.

The thickness of the polymer layer formed using the polymer is preferably in the range of 5 to 5,000 nm because the adhesion between the mold and the metal particle layer described later can be further improved, and more preferably in the range of 10 to 200 nm because the finally obtained shield layer has excellent adhesion to the mold.

The metal particle layer forming the shield layer in the present invention is preferably composed of metal particles dispersed by a polymer dispersant because the metal particles have excellent adhesion to the mold or the polymer layer.

The polymer dispersant is preferably a polymer having a functional group that coordinates to the metal particles. Examples of the functional group include a carboxyl group, an amino group, a cyano group, an acetoacetyl group, a phosphorus atom-containing group, a thiol group, a thiocyanato group, and a glycinato group.

The polymer dispersant preferably contains the compound (b1) having a reactive functional group [Y] in order to improve the adhesion to the mold or the polymer layer.

The reactive functional group of the compound (b1) is involved in bonding with an epoxy group, a phenolic hydroxy group, or a hydroxy group present in the mold, or the reactive functional group [X] in the polymer. Specific examples of the compound (b1) include compounds having an amino group, an amide group, an alkylolamide group, a carboxyl group, an anhydrous carboxyl group, a carbonyl group, an acetoacetyl group, an epoxy group, an alicyclic epoxy group, an oxetane ring, a vinyl group, an allyl group, a (meth)acryloyl group, a (blocked) isocyanate group, an (alkoxy) silyl group or the like, and a silsesquioxane compound.

In particular, the reactive functional group [Y] is preferably a basic nitrogen atom-containing group in order to further improve the adhesion to the mold or the polymer layer.

Examples of the basic nitrogen atom-containing group include an imino group, a primary amino group, and a secondary amino group.

In addition, by using a compound having a plurality of basic nitrogen atom-containing groups in one molecule as the compound (b1), one of the basic nitrogen atom-containing groups is involved in bonding with the epoxy group present in the mold or the reactive functional group [X] of the polymer forming the polymer layer, and the other contributes to interaction with the metal particles contained in the metal particle layer, thereby further improving the adhesion between the finally obtained metal plating layer described later and the mold, which is preferable.

As the compound having a basic nitrogen atom-containing group, a polyalkyleneimine or a polyalkyleneimine having a polyoxyalkylene structure containing an oxyethylene unit is preferable because the dispersion stability of the metal particles and the adhesion to the polymer layer can be further improved.

The polyalkyleneimine having a polyoxyalkylene structure may be a compound in which polyethyleneimine and polyoxyalkylene are bonded in a linear form, or may be a compound in which the polyoxyalkylene is grafted to a side chain of a main chain composed of the polyethyleneimine.

Specific examples of the polyalkyleneimine having a polyoxyalkylene structure include a block copolymer of polyethyleneimine and polyoxyethylene, a compound in which a polyoxyethylene structure is introduced by addition reaction of ethylene oxide to a part of imino groups present in the main chain of polyethyleneimine, and a compound in which an amino group of polyalkyleneimine, a hydroxy group of polyoxyethylene glycol, and an epoxy group of an epoxy resin are reacted.

Examples of commercially available products of the polyalkyleneimine include "PAO2006W", "PAO306", "PAO318", and "PAO718" of "EPOMIN (registered trademark) PAO series" manufactured by Nippon Shokubai Co., Ltd.

The number average molecular weight of the polyalkyleneimine is preferably in the range of 3,000 to 30,000.

When the reactive functional group [Y] of the compound (b1) is a carboxyl group, an amino group, a cyano group, an acetoacetyl group, a phosphorus atom-containing group, a thiol group, a thiocyanato group, a glycinato group or the like, the compound (b1) can also be used as a polymer dispersant for metal particles because these functional groups also function as functional groups coordinating with metal particles.

Next, examples of the metal particles constituting the metal layer include transition metals and compounds thereof, and among the transition metals, ionic transition metals are preferable. Examples of the ionic transition metal include metals such as copper, silver, gold, nickel, palladium, platinum, and cobalt, and complexes of these metals. These metal particles may be used alone or in combination of two or more kinds thereof. Further, among these metal particles, silver particles are particularly preferable from the viewpoints of less problems in handling such as oxidation deterioration and cost.

As the metal particles, it is preferable to use particulate particles having an average particle diameter of about 1 to 20,000 nm, and it is more preferable to use metal nanoparticles having an average particle diameter of 1 to 200 nm because the copper plating deposition properties when used as a catalyst for electroless copper plating and the electric resistance when used as a seed layer for electrolytic copper plating can be further reduced in a copper plating step described later, compared with the case of using metal particles having an average particle diameter of micrometer order. In the present invention, the average particle diameter is a volume-average value measured by a dynamic light scattering method after diluting the metal particle with a good dispersion solvent. For this measurement, "Nanotrac UPA" manufactured by MicrotracBEL Corp. can be used.

In order to form the metal particle layer, the mold is preferably applied by various application methods described later, and for this purpose, it is preferable to use a metal particle dispersion liquid in which metal particles are dispersed in various solvents. Examples of the solvent include aqueous media such as distilled water, ion-exchanged water, pure water, and ultrapure water; and organic solvents such as alcohol solvents, ether solvents, ketone solvents, and ester solvents.

Examples of the alcohol solvent or ether solvent include methanol, ethanol, n-propanol, isopropyl alcohol, n-butanol, isobutyl alcohol, sec-butanol, tert-butanol, heptanol, hexanol, octanol, nonanol, decanol, undecanol, dodecanol, tridecanol, tetradecanol, pentadecanol, stearyl alcohol, allyl alcohol, cyclohexanol, terpineol, terpineol, dihydroterpineol, 2-ethyl-1,3-hexanediol, ethylene glycol, diethylene glycol, triethylene glycol, polyethylene glycol, propylene glycol, dipropylene glycol, 1,2-butanediol, 1,3-butanediol, 1,4-butanediol, 2,3-butanediol, glycerin, ethylene glycol monomethyl ether, ethylene glycol monoethyl ether, ethylene glycol monobutyl ether, diethylene glycol monoethyl ether, diethylene glycol monomethyl ether, diethylene glycol monobutyl ether, tetraethylene glycol monobutyl ether, propylene glycol monomethyl ether, dipropylene glycol monomethyl ether, tripropylene glycol monomethyl ether, propylene glycol monopropyl ether, dipropylene glycol monopropyl ether, propylene glycol monobutyl ether, dipropylene glycol monobutyl ether, and tripropylene glycol monobutyl ether.

Examples of the ketone solvent include acetone, cyclohexanone, and methyl ethyl ketone. In addition, examples of the ester solvent include ethyl acetate, butyl acetate, 3-methoxybutyl acetate, and 3-methoxy-3-methyl-butyl acetate. Further, examples of the other organic solvent include hydrocarbon solvents such as toluene, particularly hydrocarbon solvents having 8 or more carbon atoms.

Examples of the hydrocarbon solvent having 8 or more carbon atoms include nonpolar solvents such as octane, nonane, decane, dodecane, tridecane, tetradecane, cyclooctane, xylene, mesitylene, ethyl-benzene, dodecylbenzene, tetralin, and trimethylbenzenecyclohexane, which can be used in combination with other solvents as necessary. Further, solvents such as mineral spirits and solvent naphtha, which are mixed solvents, may be used in combination.

The metal particle dispersion liquid can be produced, for example, by mixing the polymer dispersant, the metal particles, and if necessary, the solvent. Specifically, it can be produced by adding a previously prepared ionic solution of the metal to a medium in which a compound having a polyalkyleneimine chain, a hydrophilic segment, and a hydrophobic segment is dispersed, and reducing the metal ion.

In addition, in order to improve the dispersion stability of the conductive material in a solvent such as an aqueous medium or an organic solvent and the wettability to the surface to be applied, a surfactant, an anti-foaming agent, a rheology modifier, and the like may be added to the metal particle dispersion liquid as necessary.

The metal particle layer may be provided as a thin film on the entire surface and the side surface of the mold. However, in order to connect the ground pattern of the electronic component package and the shield layer, the metal particle layer needs to be provided so as to be in contact with the ground pattern exposed from the mold. In addition, it is preferable that the metal particle layer is not formed in a portion where the shield layer of the electronic component package is not formed. Examples of the portion where the shield layer of the electronic component package is not formed include a portion on the side opposite to the shield layer of the electronic component package where a solder ball is formed, a portion where the solder ball is to be formed, and the like.

The metal particle layer may be provided on the entire surface of a portion of the mold where the shield layer is to be formed, or a pattern may be formed by applying the metal particle dispersion liquid by an application method described later. When the pattern is formed by the metal particle layer, a copper plating layer and a nickel plating layer described later are formed only on the pattern of the metal particle layer, and thus the shield layer itself can be patterned. The pattern of the metal particle layer may form a portion without the metal particle layer as long as the electromagnetic wave shielding property is not impaired. For example, a pattern in which holes are formed in a dot shape in the metal particle layer, a pattern in which the metal particle layer is arranged in a lattice shape, and other various patterns may be formed.

When the metal particle dispersion liquid is applied to the surface and the side surface of the mold, examples of the application method include a coating method, a dipping method, a roller coating method, a spin coating method, a rotary method, a spray method, a dispenser method, an inkjet printing method, a pad printing method, a reverse printing method, a flexographic printing method, a screen printing method, a gravure printing method, and a gravure offset printing method. When the pattern of the metal particle layer is formed, it is preferable to use an inkjet printing method, a pad printing method, a reverse printing method, a flexographic printing method, a screen printing method, a gravure printing method, or a gravure offset printing method.

Among the application methods, it is particularly preferable to select an application method for uniformly forming a thin metal particle layer, and it is preferable to select a dipping method, a spin coating method, a spray method, an inkjet printing method, or a flexographic printing method.

In addition, when the metal particle dispersion liquid is applied, the metal particle dispersion liquid may be applied after a portion where the metal particle layer is not formed is protected by a masking tape or a sealing material. Examples of the masking tape and the sealing material include masking pressure-sensitive adhesive tapes for plating, masking tapes for printed circuit boards, dicing tapes used in processing semiconductor wafers, and thermal release sheets for electronic component processes, and it is preferable to select a material capable of protecting the portion where the shield layer is not formed even in the metal plating step described later after the sealing material is laid on the portion where the shield layer is not formed and the metal particles are applied.

Next, the metal particle dispersion liquid is applied and dried to form a metal particle layer. The drying is performed in order to volatilize the solvent contained in the metal particle dispersion liquid, or in order to form a metal particle layer having conductivity by adhering and bonding the metal particles to each other in the case of using as a conductive layer of electrolytic copper plating described later. The drying is preferably performed in a temperature range of 80 to 300° C. for about 1 to 200 minutes. Here, in order to obtain a metal particle layer (plating seed layer) having excellent adhesion to the mold or the polymer layer, the drying temperature is more preferably set in the range of 100 to 200° C.

The drying may be performed in the air, but in order to prevent all of the metal particles from being oxidized, a part or all of the drying step may be performed in a reducing atmosphere.

In addition, the drying step may be performed using, for example, an oven, a hot air drying furnace, an infrared drying furnace, laser irradiation, microwave, light irradiation (flash irradiation device), or the like.

It is preferable that the metal particle layer formed using the metal particle dispersion liquid by the method as described above contains a conductive material in the range, of 80 to 99.9% by mass and contains a polymer dispersant in the range of 0.1 to 20% by mass in the pattern.

The thickness of the metal layer formed by using the metal particle dispersion liquid is preferably in the range of 5 to 500 nm because the activity as a plating catalyst (plating deposition property) in an electroless copper plating step described later and the electric resistance as a conductive, layer in an electrolytic copper plating step can be reduced.

The copper plating layer constituting the shield layer of the present invention is used for shielding electric field noise. Examples of the method for forming the copper plating layer include wet plating methods such as electroless copper plating and electrolytic copper plating, and the copper plating layer may be formed by combining these plating methods. For example, a method of performing electroless copper plating using the metal particle layer as an electroless copper plating catalyst and performing electrolytic copper plating using the electroless copper plating layer as a conductive layer, or electrolytic copper plating using the metal particle layer as a conductive layer can be used.

Among the plating methods, an electrolytic copper plating method is more preferable because the adhesion between the metal particle layer and the copper plating layer formed by the plating method is further improved and the productivity of the copper dating step is excellent.

The electroless plating method is, for example, a method in which an electroless copper plating solution is brought into contact with the metal particle layer to deposit a copper metal contained in the electroless copper plating solution, thereby forming electroless copper plating layer composed of a metal film.

Examples of the electroless copper plating solution include a solution containing copper, a reducing agent, and a solvent such as an aqueous medium or an organic solvent.

Examples the reducing agent include dimethylaminoborane, hypophosphorous acid, sodium hypophosphite, dimethylamine borane, hydrazine, formaldehyde, sodium borohydride, and phenol.

As the electroless copper plating solution, as necessary, it is possible to use a complexing agent such as a monocarboxylic acid such as acetic acid and formic acid; a dicarboxylic acid compound such as malonic acid, succinic acid, adipic acid, maleic acid, and fumaric acid; a hydroxycarboxylic acid compound such as malic acid, lactic acid, glycolic acid, gluconic acid, and citric acid; an amino acid compound such as glycine, alanine, iminodiacetic acid, arginine, aspartic acid, and glutamic acid; an organic acid such as an amino polycarboxylic acid compound such as iminodiacetic acid, nitrilotriacetic acid, ethylenediaminediacetic acid, ethylenediaminetetraacetic acid, and diethylenetriaminepentaacetic acid, or a soluble salt (sodium salt, potassium salt, ammonium salt, and the like) of the organic acid thereof; and an amine compound such as ethylene diamine, diethylene triamine, and triethylene tetramine.

The electroless copper plating solution is preferably used in the range of 20 to 98° C.

The electrolytic copper plating method is, for example, a method of forming an electrolytic copper plating layer by causing a metal such as copper contained in an electrolytic copper plating solution to deposit on the surface of the metal particle layer provided on a cathode or the electroless copper plating layer formed by the electroless copper plating by applying an electric current in a state where the electrolytic copper plating solution is in contact with the surface of the metal constituting the metal particle layer or the electroless copper plating layer formed by the electroless copper plating.

Examples of the electrolytic copper plating solution include a solution containing a sulfide of copper, sulfuric acid, and an aqueous medium. Specific examples thereof include a solution containing copper sulfate, sulfuric acid, and an aqueous medium.

The electrolytic copper plating solution is preferably used in the range of 20 to 98° C.

As the method of the plating treatment, an electrolytic copper plating method is preferable because a highly toxic substance is not used and workability is good. In addition, the electrolytic copper plating is preferable because the plating time can be shortened and the control of the film thickness of the plating is easy, as compared with the electroless copper plating.

The thickness of the copper plating layer formed by the copper plating method is preferably in the range of 0.5 to 30 µm because of excellent electric field shielding properties. When the copper plating layer is formed by the electrolytic copper plating method, the thickness of the layer can be adjusted by controlling the treatment time, the current density, the amount of the plating additive used, and the like in the plating treatment step.

The nickel plating layer constituting the shield layer of the present invention is used for shielding magnetic field noise. The nickel plating layer is also used to prevent oxidation deterioration and corrosion of the surface of the copper plating layer. Examples of the method for forming the nickel plating layer include wet plating methods such as electroless nickel plating and electrolytic nickel plating, and the nickel plating layer may be formed by combining these plating methods. The nickel layer is preferably formed by electrolytic nickel plating because of excellent magnetic field shielding properties.

A plating layer of another metal may be stacked on the nickel plating layer. For example, when a gold plating layer, a tin plating layer, or a chromium plating layer is provided, corrosion of the surface of the nickel plating layer can be prevented. Further, the metal particle layer may be formed as a protective film on the nickel plating layer. Examples of the metal particle layer include a silver nanoparticle layer. Further, a resin film may be formed as a protective film on the nickel plating layer. Examples of the resin film include the resins exemplified as the polymer layer.

The thickness of the nickel plating layer formed by the nickel plating method is preferably in the range of 0.5 to 10 µm because of excellent magnetic field shielding properties.

Next, a method for manufacturing the electronic component package of the present invention will be described. Examples of the manufacturing method include a manufacturing method including: applying a dispersion liquid having metal particles to a surface of a mold of an electronic component package having an electronic component mounted on a circuit board having a ground pattern and the mold containing an epoxy resin that encapsulates the electronic component and drying the dispersion liquid to form a metal particle layer; forming a copper plating layer on the metal particle layer by using at least one selected from the group consisting of electroless copper plating and electrolytic copper plating; forming a nickel plating layer by using at least one selected from the group consisting of electroless nickel plating and electrolytic nickel plating; and forming a shield layer having the metal particle layer, the copper plating layer, and the nickel plating layer.

Here, as the manufacturing method, a manufacturing method in which a polymer layer is formed by applying and drying a fluid containing a polymer on the surface of the mold, a metal particle layer is formed by applying and drying a dispersion liquid containing metal particles on the polymer layer, and then the shield layer having the copper plating layer and the nickel plating layer is formed is preferable because the adhesion between the mold and the shield layer is excellent.

The polymer layer is preferably provided as a thin film on the entire surface of the mold, but in order to connect the ground pattern and the shield layer of the electronic component package, the polymer layer is preferably provided avoiding the ground pattern exposed from the mold. In addition, it is preferable that the polymer layer is not formed in a portion where the shield layer of the electronic component package is not formed. Examples of the portion where the shield layer of the electronic component package is not formed include a circuit board side opposite to the shield layer of the electronic component package, a portion where a solder ball is formed, and a portion where a solder ball is to be formed.

As a method of forming the metal particle layer on the surface of the mold or on the polymer layer, a method of applying or printing a metal particle dispersion liquid and a method of drying may be carried out by the above-exemplified methods, and in the case where the metal particles are nanoparticles such as silver nanoparticles, the above-described drying method can fuse the metal particles to form a conductive layer which functions as a plating seed layer the electrolytic plating, which is preferable.

As a method of forming the polymer layer on the surface of the mold, a method of applying or printing a fluid containing a polymer and a method of drying may be carried out by the above-exemplified methods, and the polymer layer be formed by heat-curing the polymer or curing the polymer with ultraviolet rays as necessary.

In the method of manufacturing the electronic component package, the method of forming the shield layer before singulating the electronic component package may include forming the polymer layer, dicing a part of the mold from above the polymer layer so as to expose the ground pattern to form a slit portion in a scheduled division line, forming the metal particle layer on a surface of the polymer layer and a diced surface of the slit portion, stacking the copper plating layer and the nickel plating layer to form the shield layer, and singulating the electronic component using the slit portion.

The above-described manufacturing method is preferable because the shield layer can be efficiently manufactured on a large number of electronic component packages and productivity is excellent.

Here, the slit portion formed in the scheduled division line is provided to connect the ground pattern included in the circuit board of the electronic component package and the shield layer formed of the metal particle layer, the copper plating layer, and the nickel plating layer. When the metal particle layer is formed, a fluid containing metal particles is preferably applied so as to be in contact with the ground pattern to form the metal particle layer.

The slit portion formed in the scheduled division line may be formed after the electronic component package is fixed to a support before or after the electronic component package is encapsulated. The support may be the same as a temporary fixing substrate described later.

In addition, in the method of manufacturing the electronic component package, the method of forming the shield layer after singulating the electronic component, package may include forming the polymer layer, singulating the electronic component encapsulated with the mold by dicing from above the polymer layer, temporarily fixing the singulated electronic component to a temporary fixing substrate, forming the metal particle layer on a surface of the polymer layer of the singulated electronic component and a diced surface generated by dicing, stacking the copper plating layer and the nickel plating layer to form the shield layer, grounding the shield layer to the ground pattern, and then taking out the singulated electronic component from the temporary fixing substrate.

Here, examples of the temporary fixing substrate include, as a pressure-sensitive adhesive sheet or a pressure-sensitive adhesive film obtained by pressure-sensitive adhesive processing on a support, fluororesin pressure-sensitive adhesive films using a fluororesin film as a support, masking pressure-sensitive adhesive tapes for plating, masking tapes for printed circuit boards, dicing tapes used in processing semiconductor wafers, and thermal release sheets for electronic component processes. The temporary fixing substrate can also be used for the purpose of protecting the portion where the shield layer is not formed.

Next, the method of forming a copper plating layer or a nickel plating layer on a metal particle layer by electrolytic plating or electroless plating can be carried out by the wet plating method as exemplified above, and in particular, the electrolytic plating method is preferably used from the viewpoints of productivity, mechanical properties of the obtained metal film, cost, and excellent magnetic field shielding properties in nickel plating.

The electronic component package of the present invention manufactured in this manner can be used as an electronic component package in the applications as exemplified above.

EXAMPLES

Hereinafter, the present invention will be described in detail with reference to examples.

Preparation Example 1: Preparation of Metal Particle Dispersion Liquid

Silver particles having an average particle diameter of 30 nm were dispersed in a mixed solvent of 30 parts by mass of ethylene glycol and 70 parts by mass of ion-exchanged water using a compound obtained by adding polyoxyethylene to polyethylene imine as a dispersant, and then ion-exchanged water, ethanol, and a surfactant were added to adjust the viscosity to 10 mPa·s, thereby preparing a metal particle dispersion liquid. The metal particle dispersion liquid contains metal particles and a polymer dispersant having a basic nitrogen atom-containing group as a reactive functional group.

Production Example 1: Production of Resin for Polymer Layer

In a reaction vessel equipped with a stirrer, a reflux condenser, a nitrogen inlet tube, and a thermometer, 100 parts by mass of a polycarbonate polyol (polycarbonate diol having an acid group equivalence of 1,000 g/equivalent obtained by reacting 1,4-cyclohexanedimethanol with a carbonate ester), 9.7 parts by mass of 2,2-dimethylolpropionic acid, 5.5 parts by mass of 1,4-cyclohexanedimethanol, and 51.4 parts by mass of dicyclohexylmethane diisocyanate were reacted in a mixed solvent of 111 parts by mass of methyl ethyl ketone, thereby obtaining an organic solvent solution of a urethane prepolymer having an isocyanate group at a molecular terminal.

Next, 7.3 parts by mass of triethylamine was added to the organic solvent solution of a urethane resin to neutralize a part or all of the carboxyl groups of the urethane resin, and 355 parts by mass of water was further added and sufficiently stirred to obtain an aqueous dispersion of the urethane resin.

Next, 4.3 parts by mass of a 25% by mass ethylenediamine aqueous solution was added to the aqueous dispersion, stirred to chain-extend the particulate polyurethane resin, followed by aging and solvent removal to obtain an aqueous dispersion of a urethane resin having a solid content concentration of 30% by mass.

A reaction vessel equipped with a stirrer, a reflux condenser, a nitrogen inlet tube, a thermometer, a dropping funnel for dropping the monomer mixture, and a dropping funnel for dropping the polymerization catalyst was charged with 140 parts by mass of deionized water and 100 parts by mass of the aqueous dispersion of a urethane resin obtained above, and the temperature was raised to 80° C. while blowing nitrogen. Into the reaction vessel heated to 80° C., a monomer mixture containing 60 parts by mass of methyl methacrylate, 10 parts by mass of n-butyl acrylate, and 30 parts by mass of N-n-butoxymethylacrylamide and 20 parts by mass of an aqueous ammonium persulfate solution (concentration: 0.5% by mass) were added dropwise with stirring from separate dropping funnels over 120 minutes while maintaining the temperature in the reaction vessel at 80±2° C. to perform polymerization.

After completion of the dropwise addition, the mixture was stirred at the same temperature for 60 minutes, and then the temperature in the reaction vessel was cooled to 40° C., deionized water was added so that the nonvolatile content became 20% by mass, and the mixture was filtered through a 200 mesh filter cloth to obtain a resin for a polymer layer containing a carboxyl group and an N-n-butoxymethylacrylamide group as reactive functional groups.

Preparation Example 2: Preparation of Fluid Containing Resin for Polymer Layer

To 10 parts by mass of the resin for a polymer layer obtained in the "Production of Resin for Polymer Layer", 90 parts by mass of ethanol was stirred and mixed to obtain a fluid containing the resin for a polymer layer.

Example 1

An electronic component mounted on a circuit board having a ground pattern is encapsulated with a semiconductor encapsulating resin composition containing an epoxy resin, a phenol resin curing agent, and a filler. The metal particle dispersion liquid prepared in Preparation Example 1 was applied to the surface of the mold by a spray device (a spray device equipped with a spray tip QTKA (flow rate size: 0.1 L/min) of a spray nozzle manufactured by Spraying Systems Co.) so that the film thickness of a metal particle layer after drying became 150 nm. Thereafter, by drying at 180° C. for 10 minutes, a metal particle layer was formed. The surface resistance value of the metal particle layer was 4 Ω/□.

Next, on the metal particle layer formed in the above-described manner, a phosphorus-containing copper was set as an anode, and electrolytic copper plating was performed for 10 minutes at a current density of 2.5 A/dm$^2$ using an electrolytic plating solution containing copper sulfate, whereby a copper plating layer having a thickness of 5 μm was stacked on the surface of the metal particle layer. As the electrolytic copper plating solution, 70 g/L of copper sulfate, 200 g/L of sulfuric acid, 50 mg/L of chlorine ions, and 5 mL/L of an additive ("Top Lucina SF-M" manufactured by Okuno Chemical Industries Co., Ltd.) were used.

Next, a 2 μm-thick nickel plating layer was stacked on the copper plating layer formed in the above-described manner by performing electrolytic nickel plating on the copper plating layer at a current density of 2 A/dm$^2$ for 5 minutes while supplying nickel ions with nickel sulfate to form a shield layer.

Example 2

An electronic component mounted on a circuit board having a ground pattern is encapsulated with a semiconductor encapsulating resin composition containing an epoxy resin, a phenol resin curing agent, and a filler. The fluid containing the resin for a polymer layer prepared in Preparation Example 2 was applied to the surface of the mold by a spray device (a spray device equipped with a spray tip QTKA (flow rate size: 0.1 L/min) of a spray nozzle manufactured by Spraying Systems Co.) so that the film thickness of a polymer layer after drying became 200 nm. Thereafter, by drying at 150° C. for 10 minutes, a polymer layer was formed.

Next, the metal particle dispersion liquid prepared in Preparation Example 1 was applied onto the polymer layer formed in the above-described manner by a spray device (a spray device equipped with a spray tip QTKA (flow rate size: 0.1 L/min) of a spray nozzle manufactured by Spraying Systems Co.) so that the film thickness of a metal particle layer after drying became 150 nm. Thereafter, by drying at 180° C. for 10 minutes, a metal particle layer was formed. The surface resistance value of the metal particle layer was 4 Ω/□.

Next, electrolytic copper plating and electrolytic nickel plating were performed on the metal particle layer which was formed in the above-described manner in the same manner as in Example 1 to form a shield layer formed of a copper plating layer having a thickness of 5 μm and a nickel plating layer having a thickness of 2 μm.

Example 3

An electronic component mounted on a circuit board having a ground pattern is encapsulated with a semiconductor encapsulating resin composition containing an epoxy resin, a phenol resin curing agent, and a filler. Next, a masking pressure-sensitive adhesive tape for plating was attached to the circuit board side of the mold in which the electronic component was encapsulated, on which the shield layer was not formed. Then, the fluid containing the resin for a polymer layer prepared in Preparation Example 2 was applied to the surface of the mold by a spray device (a spray device equipped with a spray tip QTKA (flow rate size: 0.1 L/min) of a spray nozzle manufactured by Spraying Systems Co.) so that the film thickness of a polymer layer after drying became 200 nm. Thereafter, by drying at 150° C. for 10 minutes, a polymer layer was formed.

Next, the surface of the polymer layer formed in the above-described manner was subjected to half-dicing along the scheduled division line with a diamond blade of a dicing apparatus to form a slit portion. It was found that there was no polymer layer in the slit portion and the ground line of the circuit board was exposed.

Next, the metal particle dispersion liquid prepared in Preparation Example 1 was printed on the mold obtained above, on which the polymer layer was formed and the slit portion was formed by half-dicing. The metal particle dispersion liquid was printed using an ink jet printer (ink jet tester EB100, printer head KM512L for evaluation, discharge amount 14 pL, manufactured by Konica Minolta IJ Inc.) first along the slit portion, and then the entire surface of the mold was printed. Thereafter, by drying at 150° C. for 10 minutes, a metal particle layer was formed. The film thickness of the metal particle layer was 80 nm as an average film thickness at each portion.

Next, electroless copper plating was performed on the metal particle layer formed in the above-described manner to form an electroless copper plating film having a thickness of 0.2 μm. The electroless copper plating was performed by preparing a bath of ARG copper (manufactured by Okuno Chemical Industries Co., Ltd.) under standard recommended conditions (ARG copper 1:30 mL/L, ARG copper 2:15 mL/L, ARG copper 3:200 mL/L), keeping the bath temperature at 45° C., and immersing the substrate having the metal particle layer formed thereon for 15 minutes to deposit a copper plating film.

Next electrolytic copper plating and electrolytic nickel plating were performed on the electroless copper plating layer which was formed in the above-described manner in the same manner as in Example 1 form a shield layer formed of a copper plating layer having a thickness of 5 μm and a nickel plating layer having a thickness of 2 μm.

Example 4

An electronic component mounted on a circuit board having a ground pattern is encapsulated with a semiconductor encapsulating resin composition containing an epoxy resin, a phenol resin curing agent, and a filler. Then, the fluid containing the resin for the polymer layer prepared in Preparation Example 2 was applied to the surface of the mold by a spray device (a spray device equipped with a spray tip QTKA (flow rate size: 0.1 L/min) of a spray nozzle manufactured by Spraying Systems Co.) so that the film thickness of a polymer layer after drying became 200 nm. Thereafter, by drying at 120° C. for 10 minutes, a polymer layer was formed.

Next, the surface of the polymer layer formed in the above-described manner was diced along the division line into individual pieces each having a length of 10 mm and a width of 10 mm with a diamond blade of a dicing apparatus. It was found that there was no polymer layer in the portion of the singulated mold in contact with the diamond blade, and the ground line of the circuit board was exposed. Next, 40 pieces of the singulated mold were attached to the thermal release sheet for electronic component process at a 2 mm interval.

Next, the metal particle dispersion liquid prepared in Preparation Example 1 was printed on the surface of the mold attached to the thermal release sheet for an electronic component process in the above-described manner. The metal particle dispersion liquid was also printed on the surface of the mold, the side surface cut out by dicing, and the surface of the thermal release sheet for the electronic component process to which the mold was attached, using an ink jet printer (ink jet tester EB100, printer head KM512L for evaluation, discharge amount 14 pL, manufactured by Konica Minolta IJ Inc.). Thereafter, by drying at 100° C. for 10 minutes, a metal particle layer was formed. The film thickness of the metal particle layer was 90 nm as an average film thickness at each portion.

Next, electroless copper plating was performed on the metal particle layer formed in the above-described manner in the same manner as in Example 3 to form an electroless copper plating layer having a thickness of 0.2 μm.

Next, electrolytic copper plating and electrolytic nickel plating were performed on the electroless copper plating layer which was formed in the above-described manner in the same manner as in Example 1 to form a shield layer formed of a copper plating layer having a thickness of 5 μm and a nickel plating layer having a thickness of 2 μm.

Comparative Example 1

An electronic component mounted on a circuit board having a ground pattern is encapsulated with a semiconductor encapsulating resin composition containing an epoxy resin, a phenol resin curing agent, and a filler. In order to roughen the surface of the mold, the filling material in the mold was dissolved using hydrofluoric acid, and roughening treatment was performed on the surface of the mold. For the roughening treatment, a chemical prepared by dissolving 150 g/L of ammonium fluoride in 1000 mL/L of 62% nitric acid was used. The roughening treatment temperature was 40° C., and the roughening treatment time was 20 minutes.

Next, the mold subjected to the roughening treatment in the above-described manner was immersed in a catalyst liquid made of a stannous chloride protective colloid solution of palladium as an electroless copper plating catalyst (aqueous solution containing 40 mL/L of Catalyst C (trade name) manufactured by Okuno Chemical Industries Co., Ltd. and 180 mL/L of 35% hydrochloric acid) at 30° C. for 3 minutes. Next, the electroless copper plating catalyst was activated by immersing in an aqueous solution containing 100 mL/L of 98% sulfuric acid at 40° C. for 3 minutes.

Next, the mold subjected to the roughening treatment, the application of the electroless copper plating catalyst, and the activation treatment in the above-described manner was subjected to electroless copper plating in the same manner as in Example 3 to form an electroless copper plating layer having a thickness of 0.2 μm.

Next, electrolytic copper plating and electrolytic nickel plating were performed on the electroless copper plating layer which was formed in the above-described manner in the same manner as in Example 1 to form a shield layer formed of a copper plating layer having a thickness of 5 μm and a nickel plating layer having a thickness of 2 μm.

Comparative Example 2

An electronic component mounted on a circuit board having a ground pattern was encapsulated with a semiconductor encapsulating res composition containing an epoxy resin, a phenol resin curing agent, and a filler. The surface of the mold was subjected to sputtering process according to a film forming method of magnetron sputtering. A copper film having a thickness of 0.2 μm was formed by this sputtering method.

Next, electrolytic copper plating and electrolytic nickel plating were performed on the copper film formed in the above-described manner in the same manner as in Example 1 to form a shield layer formed of a copper plating layer having a thickness of 5 μm and a nickel plating layer having a thickness of 2 μm.

<Measurement of Adhesion (Peel Test) of Shield Layer>

For each of the electronic component packages having the shield layer formed thereon obtained as described above, the peel strength between the mold and the shield layer measured using "Autograph AGS-X 500N" manufactured by Shimadzu Corporation. The lead width used for the measurement was set to 1 mm, and the peel angle was set to 90°. In addition, the measurement of the peel strength in the present invention was carried out on the basis of the measured value when the thickness of the shield layer was 7 μm.

<Measurement of Adhesion (Peel Test) of Shield Layer After Heating>

Each of the electronic component packages having the shield layer formed thereon obtained as described above was stored and heated in a dryer set at 150° C. for 168 hours. After heating, the peel strength was measured in the same manner as described above.

<Heat Resistance Evaluation>

Using the peel strength values before and after heating measured above, retention rates before and after heating were calculated, and heat resistance was evaluated according to the following criteria.

A: The retention rate is 80% or more.
B: The retention rate is 70% or more and less than 80%.
C: The retention rate is 50% or more and less than 70%.
D: The retention rate is less than 50%.

Table 1 shows the measurement results of the peel strength and the evaluation results of the heat resistance before and after heating with respect to the shield layer of each of the electronic component packages having a shield layer formed therein which were obtained in Examples 1 to 4 and Comparative Examples 1 and 2.

TABLE 1

|  |  |  | Example 1 | Example 2 | Example 3 | Example 4 | Comparative Example 1 | Example 2 |
|---|---|---|---|---|---|---|---|---|
| Roughening treatment of mold |  |  | No | No | No | No | Yes | No |
| Polymer layer |  |  | No | Yes | Yes | Yes | No | No |
| Metal particle layer |  |  | Silver particle | Silver particle | Silver particle | Silver particle | No | No |
| Sputtering layer |  |  | No | No | No | No | No | Copper sputtering |
| Evaluation results | Peel strength of stacked layer (N/m) | Before heating | 350 | 560 | 600 | 610 | 180 | 150 |
|  |  | After heating | 280 | 460 | 520 | 480 | 30 | 50 |
|  | Retention rate of peel strength (%) |  | 80 | 82 | 87 | 79 | 17 | 33 |
|  | Heat resistance |  | A | A | A | B | D | D |

From the results shown in Table 1, it was found that the shield layers obtained in Examples 1 to 4, which are electronic component packages in which the shield layer of the present invention was formed, had a high peel strength between the mold and the shield layer, a slight decrease in peel strength after heating, a high retention rate of peel strength after heating, and an excellent heat resistance.

On the other hand, the electronic component package having the shield layer formed thereon obtained in Comparative Example 1 is an example in which the mold was subjected to roughening treatment and then the metal plating film was formed, and it was found that the peel strength was very low before and after heating.

In addition, the electronic component package having the shield layer formed thereon obtained in Comparative Example 2 is an example in which a metal layer was formed on a support using a sputtering method and then metal plating was performed, and it was found that the peel strength was very low before and after heating.

REFERENCE SIGNS LIST

1: Circuit board
2: Shield layer
3: Metal particle layer
4: Copper plating layer
5: Nickel plating layer
6: Ground pattern
7: Wiring pattern
8: Connection pad with another circuit board or the like
9: Electronic component such as semiconductor device
10: Polymer layer
11: Mold

The invention claimed is:

1. A method for manufacturing an electronic component package, comprising:
    applying a fluid containing a polymer to a surface of a mold of an electronic component package having an electronic component mounted on a circuit board having a ground pattern and a mold containing an epoxy resin that encapsulates the electronic component and drying the fluid to form a polymer layer;
    applying a dispersion liquid having metal particles on the polymer layer and drying the dispersion liquid to form a metal particle layer;
    forming a copper plating layer on the metal particle layer by using at least one selected from the group consisting of electroless copper plating and electrolytic copper plating;
    forming a nickel plating layer by using at least one selected from the group consisting of electroless nickel plating and electrolytic nickel plating; and
    forming a shield layer comprising the metal particle layer, the copper plating layer, and the nickel plating layer.

2. The method for manufacturing an electronic component package according to claim 1, wherein after forming the polymer layer, a part of the mold is diced from above the polymer layer so as to expose the ground pattern to form a slit portion, the metal particle layer is formed on a surface of the polymer layer and a diced surface of the slit portion, the copper plating layer and the nickel plating layer are stacked to form the shield layer, and the electronic component is singulated using the slit portion.

3. The method for manufacturing an electronic component package according to claim 1, wherein after forming the polymer layer, the electronic component encapsulated with the mold is singulated by dicing from above the polymer layer, the singulated electronic component is temporarily fixed to a temporary fixing substrate, the metal particle layer is formed on a surface of the polymer layer of the singulated electronic component and a diced surface generated by dicing, the copper plating layer and the nickel plating layer are stacked to form the shield layer, the shield layer is grounded to the ground pattern, and then the singulated electronic component is taken out from the temporary fixing substrate.

* * * * *